United States Patent
Li et al.

(10) Patent No.: US 11,676,900 B2
(45) Date of Patent: Jun. 13, 2023

(54) ELECTRONIC ASSEMBLY THAT INCLUDES A BRIDGE

(71) Applicant: Intel Corporation, Santa Clara, CA (US)

(72) Inventors: Eric J. Li, Chandler, AZ (US); Nitin Deshpande, Chandler, AZ (US); Shawna M. Liff, Scottsdale, AZ (US); Omkar Karhade, Chandler, AZ (US); Amram Eitan, Scottsdale, AZ (US); Timothy A. Gosselin, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/778,398

(22) PCT Filed: Dec. 22, 2015

(86) PCT No.: PCT/US2015/067418
§ 371 (c)(1),
(2) Date: May 23, 2018

(87) PCT Pub. No.: WO2017/111950
PCT Pub. Date: Jun. 29, 2017

(65) Prior Publication Data
US 2018/0358296 A1 Dec. 13, 2018

(51) Int. Cl.
*H01L 25/00* (2006.01)
*H01L 23/538* (2006.01)
(Continued)

(52) U.S. Cl.
CPC ...... *H01L 23/5381* (2013.01); *H01L 21/4853* (2013.01); *H01L 21/4871* (2013.01);
(Continued)

(58) Field of Classification Search
CPC ............ H01L 23/5381; H01L 21/4853; H01L 21/4871; H01L 23/5386; H01L 23/5385;
(Continued)

(56) References Cited

U.S. PATENT DOCUMENTS 9,349,703 B2 * 5/2016 Chiu ................... H01L 24/23
9,478,504 B1 * 10/2016 Shen ................ H01L 23/49838
(Continued)

FOREIGN PATENT DOCUMENTS

DE 112015007216 9/2018
KR 20170044219 A * 4/2017 ........... H05K 3/4697
(Continued)

OTHER PUBLICATIONS

"International Application Serial No. PCT/US2015/067418, International Search Report dated Sep. 20, 2016", 3 pgs.
(Continued)

*Primary Examiner* — Samuel Park
(74) *Attorney, Agent, or Firm* — Schwabe, Williamson & Wyatt, P.C.

(57) ABSTRACT

An electronic assembly that includes a substrate having an upper surface and a bridge that includes an upper surface. The bridge is within a cavity in the upper surface of the substrate. A first electronic component is attached to the upper surface of the bridge and the upper surface of the substrate and a second electronic component is attached to the upper surface of the bridge and the upper surface of the substrate, wherein the bridge electrically connects the first electronic component to the second electronic component.

12 Claims, 3 Drawing Sheets

CHIP ATTACHED TO SUBSTRATE (WITH HEAT SINK)

(51) Int. Cl.
*H01L 23/48* (2006.01)
*H01L 25/065* (2023.01)
*H01L 23/36* (2006.01)
*H01L 23/13* (2006.01)
*H01L 21/48* (2006.01)
*H01L 23/00* (2006.01)
*H01L 23/367* (2006.01)

(52) U.S. Cl.
CPC ............. *H01L 23/13* (2013.01); *H01L 23/36* (2013.01); *H01L 23/48* (2013.01); *H01L 23/5385* (2013.01); *H01L 23/5386* (2013.01); *H01L 25/0655* (2013.01); *H01L 25/50* (2013.01); *H01L 23/367* (2013.01); *H01L 24/13* (2013.01); *H01L 24/16* (2013.01); *H01L 24/32* (2013.01); *H01L 24/73* (2013.01); *H01L 24/81* (2013.01); *H01L 24/92* (2013.01); *H01L 2224/0612* (2013.01); *H01L 2224/131* (2013.01); *H01L 2224/13147* (2013.01); *H01L 2224/16227* (2013.01); *H01L 2224/32225* (2013.01); *H01L 2224/73204* (2013.01); *H01L 2224/81191* (2013.01); *H01L 2224/81192* (2013.01); *H01L 2224/81193* (2013.01); *H01L 2224/81203* (2013.01); *H01L 2224/92125* (2013.01); *H01L 2924/15159* (2013.01)

(58) Field of Classification Search
CPC ......... H01L 23/36; H01L 23/13; H01L 25/50; H01L 25/0655; H01L 23/48; H01L 23/367; H01L 2924/15159; H01L 2224/92125; H01L 2224/81203; H01L 2224/81193; H01L 2224/81192; H01L 2224/81191; H01L 2224/73204; H01L 2224/32225; H01L 2224/16227; H01L 2224/13147; H01L 2224/131; H01L 2224/0612; H01L 24/92; H01L 24/81; H01L 24/73; H01L 24/32; H01L 24/16; H01L 24/13
See application file for complete search history.

(56) References Cited

U.S. PATENT DOCUMENTS

| | | | | |
|---|---|---|---|---|
| 2006/0118925 A1* | 6/2006 | Macris | .................. | H01L 23/433 257/667 |
| 2006/0226527 A1* | 10/2006 | Hatano | ............... | H01L 25/0655 257/686 |
| 2008/0116569 A1 | 5/2008 | Huang et al. | | |
| 2009/0178273 A1* | 7/2009 | Lauffer | ................. | H05K 3/4694 29/830 |
| 2009/0244874 A1* | 10/2009 | Mahajan | ................. | H01L 24/16 361/809 |
| 2009/0267238 A1* | 10/2009 | Joseph | ................ | H01L 25/0652 257/777 |
| 2011/0241195 A1 | 10/2011 | Nalla | | |
| 2011/0285006 A1* | 11/2011 | Weng | ........................ | H01L 24/82 257/686 |
| 2012/0091594 A1* | 4/2012 | Landesberger | ........ | H01L 23/552 257/774 |
| 2012/0132463 A1* | 5/2012 | Mori | ..................... | H05K 3/4007 174/260 |
| 2012/0261838 A1 | 10/2012 | Braunisch et al. | | |
| 2012/0292651 A1* | 11/2012 | You | ......................... | H01L 24/32 257/98 |
| 2013/0214410 A1* | 8/2013 | Khan | ...................... | H01L 23/12 257/738 |
| 2014/0021761 A1 | 8/2014 | Jeng et al. | | |
| 2014/0239514 A1* | 8/2014 | Haba | ....................... | H01L 24/49 257/778 |
| 2015/0001717 A1* | 1/2015 | Karhade | ............. | H01L 25/0655 257/741 |
| 2015/0108628 A1* | 4/2015 | Yu | ........................... | H01L 23/42 257/712 |
| 2015/0116965 A1* | 4/2015 | Kim | .................... | H01L 23/5385 361/767 |
| 2015/0118794 A1* | 4/2015 | Lin | ................... | H01L 23/49838 438/107 |
| 2015/0160701 A1* | 6/2015 | Bruno | ..................... | H01L 23/13 361/679.31 |
| 2016/0071818 A1* | 3/2016 | Wang | ..................... | H01L 24/89 257/774 |
| 2016/0133571 A1* | 5/2016 | Lee | ..................... | H01L 23/5383 257/774 |
| 2016/0372448 A1* | 12/2016 | Yazdani | .................. | H01L 23/04 |
| 2017/0111999 A1* | 4/2017 | Ahn | ..................... | H05K 3/4697 |

FOREIGN PATENT DOCUMENTS

| | | |
|---|---|---|
| TW | 201725683 A | 7/2017 |
| WO | WO-2017111950 A1 | 6/2017 |

OTHER PUBLICATIONS

"International Application Serial No. PCT/US2015/067418, Written Opinion dated Sep. 20, 2016", 7 pgs.

Office Action from Taiwan Patent Application No. 105137825, dated Jul. 2, 2020, 8 pgs.

Office Action from German Patent Application No. 112015007216, dated Jun. 4, 2020, 12 pgs.

Notice of Allowance from Taiwan Patent Application No. 105137825, dated Dec. 14, 2020, 3 pgs.

* cited by examiner

SUBSTRATE WITH CAVITY AND BONDING PADS ON COARSE PITCH REGION

ADHESIVE DISPENSE

BRIDGE WITH BONDING PADS

THERMAL COMPRESSION BONDING OF BRIDGE INTO SUBTRATE CAVITY

SUBSTRATE WITH BRIDGE DIE PLACED INSIDE THE CAVITY

CHIP ATTACHED TO SUBSTRATE

CHIP ATTACHED TO SUBSTRATE (WITH HEAT SINK)

ELECTRONIC ASSEMBLY THAT INCLUDES A BRIDGE

CROSS-REFERENCE TO RELATED APPLICATION

This application is a U.S. National Stage Filing under 35 U.S.C. 371 from International Application No. PCT/US2015/067418, filed on Dec. 22, 2015, and published as WO 2017/111950, which application is incorporated herein by reference in its entirety.

TECHNICAL FIELD

Embodiments described herein generally relate to electronic assemblies, and more particularly to electronic assemblies that include a bridge.

BACKGROUND

Many conventional electronic devices include platform designs that have one electronic component (e.g., a memory module) placed on a printed circuit board along with another electronic component (e.g., a silicon-on-chip electronic device). There are usually physical connections between the electronic components through routings in a printed circuit board. There may also be physical connections between the electronic components and other additional electronic components that are mounted on the printed circuit board.

The typical design usually requires there to be routings within multiple layers in the printed circuit board. In addition, mounting electronic components alongside one another on a printed circuit board usually requires relatively large amounts of real estate on the printed circuit board. Often times, the number, type and size of the electronic routings that are between the electronic components determines the layer count as well as the overall size of the printed circuit board.

One technique that is commonly used to address the drawbacks associated with placing electronic components side by side on a printed circuit board is to utilize an embedded bridge package architecture. An embedded bridge package architecture embeds a bridge inside a substrate and then electrically connects the bridge to an upper surface of the substrate through one or more routing wires. The top surface of the substrate typically includes mixed pitch regions. As examples, a fine pitch region may be included to connect between a die on top of the substrate and the embedded bridge, and a course pitch region may be included for traditional first level interconnects between the die on the upper surface of the substrate and the substrate itself.

There are two drawbacks associated with embedding bridges inside of a substrate. One drawback is higher substrate cost due to additional processing steps that are required and technical challenges that exist relative to embedding a bridge into an organic substrate. Another drawback with embedding bridges inside a substrate relates to pitch scalability at the fine pitch region because there is typically limitations as to the alignment tolerances that can be achieved in the substrate manufacturing process.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The electronic assemblies described herein may include an interconnect structure between a between a first electronic component (e.g., a first die) and a second electronic component (e.g., a second die). The first electronic component (e.g., a silicon-on-chip electronic device) and the second electronic component (e.g., a memory module) may be interconnected using a bridge that might permit the overall size of an electronic device which includes the electronic assembly to be reduced. In addition, the electronic assemblies described herein may be cost effective to manufacture due to a relatively smaller size and/or lower layer counts within the electronic assemblies.

The electronic assemblies described herein include substrates that have one or more cavities in an upper surface of the substrate. Each cavity is configured to receive a bridge (or multiple bridges).

In some forms, the bridge may be attached to the substrate using a snap curing adhesive in conjunction with a thermal compression bonding process. Utilizing a thermal compression bonding process may ensure that the upper surface of the bridge is flat with the upper surface of the substrate. The adhesive may compensate for any topology differences at the base of the cavity.

As examples, one or more different types of dies may be mounted to the upper surface of the substrate and the upper surface of the bridge (e.g., by soldered joint formation). The dies that are bonded to the substrate and the bridge may include a course pitch region that is bonded to the substrate and a fine pitch region that is bonded to the bridge.

Figure 1:
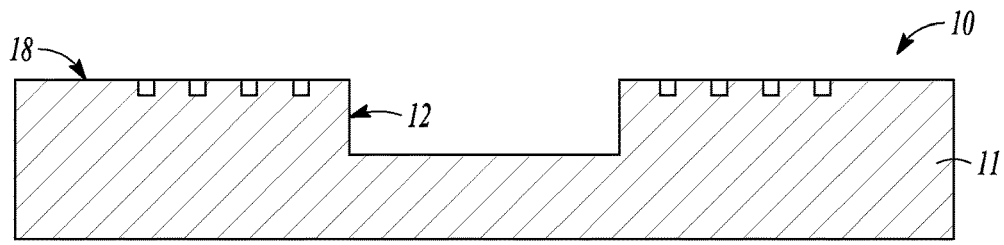
FIG. 1 is a schematic side section view of an example substrate that includes a cavity.
Figure 2:
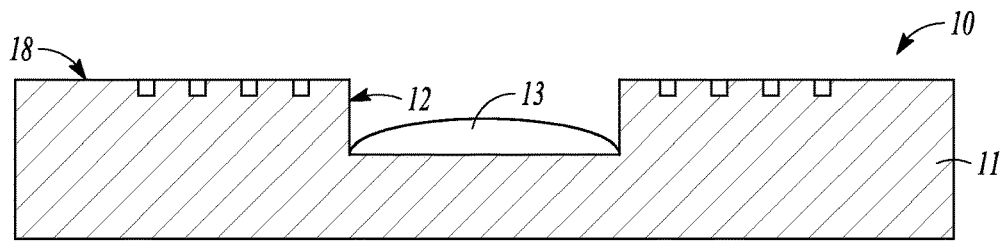
FIG. 2 is a schematic side section view of the example substrate shown in FIG. 1 where the cavity includes an adhesive.
Figure 3:
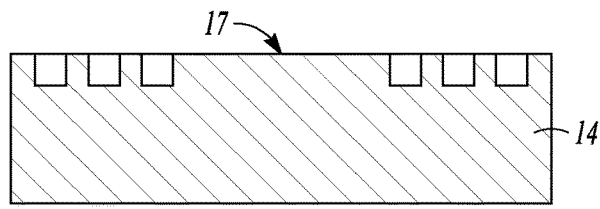
FIG. 3 is a schematic side view of an example bridge.

FIG. 1 is a schematic side section view of an example substrate 11 that includes a cavity 12. FIG. 2 is a schematic side section view of the example substrate 11 shown in FIG. 1 where the cavity 12 includes an adhesive 13 (e.g., a snap cure adhesive). FIG. 3 is a schematic side section view of an example bridge 14.

Figure 4:
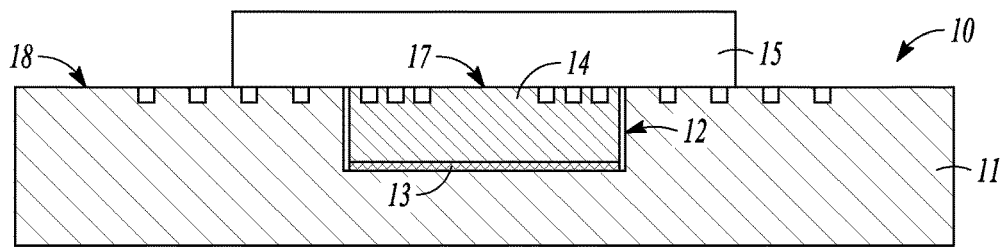
FIG. 4 is a schematic side section view of an example electronic assembly that shows the die of FIG. 3 inserted into the cavity of the substrate of FIG. 2 using a thermal compression bonding fixture.
Figure 5:
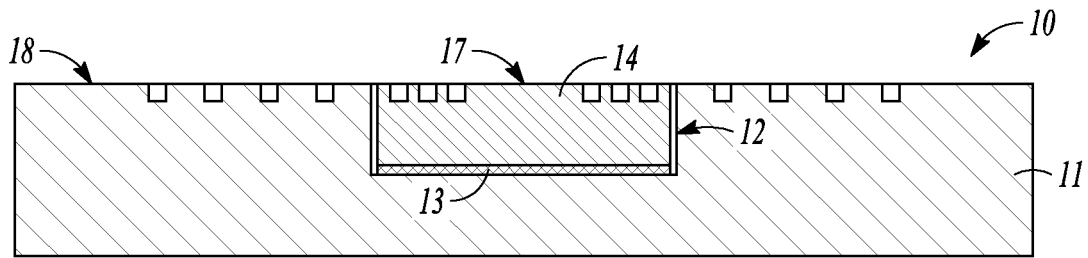
FIG. 5 is a schematic side section view of the example electronic assembly shown in FIG. 4 after the thermal compression bonding fixture has been removed.
Figure 6:
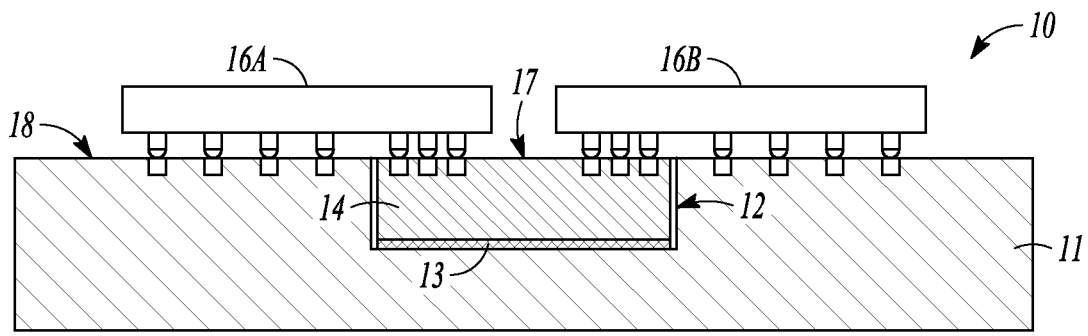
FIG. 6 is a schematic side section view of the example electronic assembly shown in FIG. 5 after dice are mounted to an upper surface of the bridge and the upper surface of the substrate.

FIG. 4 is a schematic side section view of an example electronic assembly 10 that shows the bridge of FIG. 3 inserted into the cavity 12 of the substrate 11 of FIG. 2 using a thermal compression bonding fixture 15. FIG. 5 is a schematic side section view of the example electronic assembly 10 shown in FIG. 4 after the thermal compression bonding fixture 15 has been removed. FIG. 6 is a schematic side section view of the example electronic assembly 10 shown in FIG. 5 after dice 16A, 16B are mounted to an upper surface 17 of the bridge and the upper surface 18 of the substrate 11.

Figure 7:
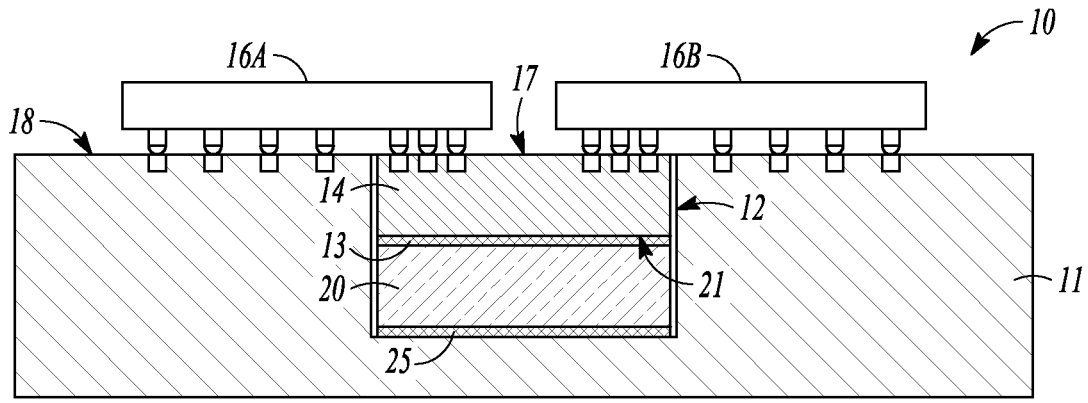
FIG. 7 is a schematic side section view of another example electronic assembly after dice are mounted to an upper surface of the bridge and the upper surface of the substrate.

FIG. 7 is a schematic section view of another example electronic assembly 10 after dice 16A, 16B are mounted to an upper surface 17 of the bridge 11 and the upper surface 18 of the substrate 11. The electronic assembly 10 shown in FIG. 7 further includes a heat sink 20 that is thermally connected to the bridge 14.

As shown most clearly in FIG. 5, the electronic assembly 10 includes a substrate 11 having an upper surface 18. The electronic assembly 10 further includes a bridge 14 that includes an upper surface 17. The bridge 14 is within a cavity 12 that is in the upper surface 18 of the substrate 11.

A first electronic component 16A is attached to the upper surface 17 of the bridge 14 and the upper surface 18 of the substrate 11. A second electronic component 16B is attached to the upper surface of the bridge 14 and the upper surface 18 of the substrate 11.

In some forms, the x, y and z dimensions of the cavity 12 are slightly larger than the size of the bridge 14 to ensure that the bridge 14 fits inside the cavity 12. The size difference between the cavity 12 and the bridge 14 will depend in part on the manufacturing processes that are used to fabricate the electronic assembly 10 (among other factors).

The bridge 14 electrically connects the first electronic component 16A to the second electronic component 16B. It should be noted that the size, type and number of connections within the bridge 14 will depend in part on the types of first and second electronic components 16A, 16B that are included in the electronic assembly 10 (among other factors).

In some forms, the first electronic component 16A and the second electronic component 16B are each dice. It should be noted that any type of electronic component that is know now, or discovered in the future, may be included in the electronic assembly 10. The types of first and second electronic components 16A, 16B that are included in the electronic assembly 10 will depend in part on the type of electronic device that will eventually incorporate the electronic assembly 10 (among other factors).

As shown in the FIGS. 6 and 7, a fine pitch region of each electronic component 16A, 16B may be attached to the bridge 14. In addition, a coarse pitch region of each electronic component may be attached to the substrate 11.

The bridge 14 may be attached to the substrate 11 with an adhesive 13. As an example, the adhesive 13 may be a snap cure adhesive. The type of adhesive 13 that is included in the electronic assembly 10 will depend in part on the type of bridge 14 and substrate 11 that are included in the electronic assembly 10 as well as the manufacturing processes that are utilized to fabricate the electronic assembly 10 (among other factors).

The amount of adhesive 13 may be optimized to ensure that there is sufficient material to hold and bond the bridge 14 to the substrate 11 without any voiding. The amount of adhesive 13 may also be regulated to ensure that there is not any adhesive on the upper surface 18 of the substrate 11 and the upper surface 17 of the bridge 14.

The electronic assembly 10 may further include an attachment film or paste as well as an adhesive in order to ensure adequate bonding of the bridge 14 within the cavity 12. In addition, the adhesive 13 may be conductive (especially if grounding of the bridge 14 is required). Grounding of the bridge 14 may be required in high performance computing applications.

In some forms, the bridge 14 may be a polygon (e.g., a square). The overall size and shape of the bridge 14 will depend in part on the number of electronic components that are to be attached to the bridge 14 as well as the overall size and shape of the substrate 11 (among other factors).

As an example, the bridge 14 may include electrically interconnects that have a pitch less than 50 micrometers. It should be noted that the pitch of the electrically interconnects within the bridge 14 will depend in part on the pitch of the electrically connections on the electronic components that are attached to the bridge 14 (among other factors).

In some forms, the substrate 11 may be a printed circuit board. It should be noted that the type of substrate 11 that is included in the electronic assembly 10 will depend in part on the application where the electronic assembly 10 is to be used. The substrate 11 may be any type of substrate that is known now, or discovered in the future.

The bridge 14 may be attached to the substrate 11 in any manner that is known now, or discovered in the future. As an example, the bridge 14 may be thermal compression bonded to the substrate 11. The manner in which the bridge 14 is attached to the substrate 11 will depend in part on the manufacturing processes that are associated with fabricating the electronic assembly 10.

The bridge 14 may have bonding pads, copper bumps or even solder bumps. The type of electrical connection between the bridge 14 and any electronic components will depend in part on the type of electrical connections that are included in the electronic components (among other factors).

In some forms, the thermal compression bonding fixture 15 may be larger than the bridge 14 in both the x and y dimensions so that the thermal compression bonding fixture 15 lands on the upper surface 18 of the substrate 11 outside the cavity 12. This type of thermal compression bonding fixture 15 ensures that the top surface 17 of the bridge 14 is aligned with the upper surface 18 of the substrate 11. In forms of the electronic assembly 10 where the bridge 14 includes bumps, the upper surface 18 of the substrate 11 may be aligned with the upper surface of the bumps on the bridge 14.

Although not shown in the FIGS., the electronic assembly 10 may further include at least one additional electronic component that is attached to the upper surface 17 of the bridge 14 and the upper surface 18 of the substrate 11. It should be noted that the number and type of additional electronic components that are attached to the upper surfaces 17, 18 of the bridge 14 and the substrate 11 will depend in part on the overall design of the electronic assembly 10 as well as the application where the electronic assembly 10 is to be used (among other factors).

As discussed above relative to FIG. 7, the electronic assembly 10 may further include a thermal conductor (e.g., heat sink 20) that is thermally connected to the bridge 14. As an example, the heat sink 20 may be attached to a lower surface 21 of the bridge 14.

The overall size and type of thermal conductor that is included in the electronic assembly 10 will depend in part on the size and type of bridge 14 as well as the amount of thermal energy that needs to be dissipated from the bridge 14 (among other factors). In some forms, the thermal conductor is attached to the lower surface 21 of the bridge 14 using a thermally conductive adhesive (although other types of adhesive or methods of attachment may be used).

In addition, the thermal conductor may extend to a lower surface of the substrate 11 instead of being embedded within the cavity 12 in the substrate 11 as shown in FIG. 7. In the example form of the electronic assembly 10 shown in FIG. 7, the heat sink 20 is adhered to a bottom surface of the cavity 12 (e.g., by using an adhesive 25).

Other forms of the electronic assembly 10 are contemplated where the electronic assembly 10 includes a plurality of bridges that each include an upper surface. The plurality of bridges are within the upper surface 18 of the substrate 11.

In addition, the electronic assembly 10 may include a plurality of first electronic components 16A where each of the first electronic components 16A is attached to the upper surface 17 of one of the bridges and the upper surface 18 of the substrate 11. The electronic assembly 10 may also include a plurality of second electronic components 16B where each of the second electronic components 16B is attached to the upper surface 17 of one of the bridges 14 and the upper surface 18 of the substrate 11. It should be noted that the bridges may electrically connect to the respective first and second electronic components 16A, 16B.

In some forms, at least some of the bridges may be embedded within the same cavity 12 in the upper surface 18 of the substrate 11. In other forms, each of the bridges may be embedded within a separate cavity 12 in the substrate 11.

The upper surface 18 of the substrate 11 may be aligned with the upper surface 17 of each bridge 14. It should be noted that when the bridges 14 are assembled to the substrate 11 (e.g., using the thermal compression bonding fixture 15 shown in FIG. 4), the upper surface 18 of the substrate 11 may be readily aligned with the upper surface 17 of each of the bridges 14, especially when the thermal compression bonding fixture 15 simultaneously bonds multiple bridges 14 within cavities 12 in the upper surface 18 of the substrate 11.

In the example forms of the electronic assembly 10 that include multiple bridges 14, the electronic assembly 10 may further include a plurality of additional electronic components (not shown) that are attached to the upper surface 17 of one of the bridges 14 and the upper surface 18 of the substrate 11.

At least one of the bridges 14 may have at least three electronic components attached to the upper surface 17 of the bridge 14 and the upper surface 18 of the substrate 11. The number of bridges 14 and electronic components that are included in the electronic assembly 10 and the number of electronic components that are attached to each bridge 14 will depend in part on the application where the electronic assembly 10 is to be used (among other factors).

It should be noted that one, some or all of the electronic components may be the same (or different) type of electronic component. In addition, one, some or all of the bridges 14 may be the same (or different) types of bridges 14.

In some forms, an underfill material may be used to fill the gap underneath the electronic components as well as any empty space between the sidewall of the bridge 14 and the edge of the cavity 12. As an example, a high pressure curing process may be used to eliminate underfill voiding if required.

Figure 8:
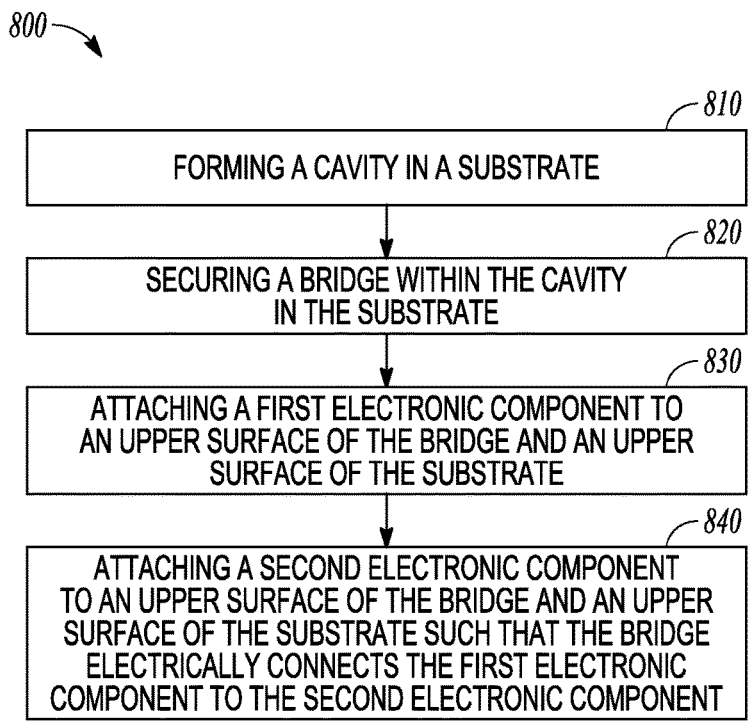
FIG. 8 is a flow diagram illustrating an example method of fabricating an electronic assembly.

FIG. 8 is a flow diagram illustrating a method [800] of fabricating an electronic assembly 10. The method [800] includes [810] forming a cavity 12 in an upper surface 18 of a substrate 11 (see FIG. 1), and [820] securing a bridge 14 within the cavity 12 in the upper surface 18 of the substrate 11 (see FIG. 4). The method [800] further includes [830] attaching a first electronic component 16A to an upper surface 17 of the bridge 14 and an upper surface 18 of the substrate 11, and [840] attaching a second electronic component 16B to an upper surface 17 of the bridge 14 and an upper surface 18 of the substrate 11 such that the bridge 14 electrically connects the first electronic component 16A (e.g., a first die) to the second electrical component 16B (e.g., a second die).

In some forms, [820] securing the bridge 14 within the cavity 12 in the upper surface 18 of the substrate 11 includes thermal compression bonding the bridge 14 to the substrate 11. It should be noted that the bridge 14 may be secured to the substrate 11 in any manner that is known now, or discovered in the future.

In addition, [820] securing the bridge 14 within the cavity 12 in the upper surface 18 of the substrate 11 may include aligning the upper surface 18 of the substrate 11 with the upper surface 17 of the bridge 14 (see FIG. 4). The upper surface 17 of the bridge 14 may be aligned with the upper surface 18 of the substrate 11 using a thermal compression bonding fixture 15 to secure the bridge 14 within the cavity 12 in the upper surface 18 of the substrate 11 (see FIG. 4).

Although not shown in the FIGS., [810] forming a cavity 12 in the upper surface 18 of the substrate 11 may include forming a plurality of cavities in the upper surface 18 of the substrate 11. In addition, [820] securing the bridge 14 within the cavity 12 and the substrate 11 may include securing a plurality of bridges 14 within cavities 12 in the upper surface 18 of the substrate 11. It should be noted that securing the plurality of bridges within the cavities 12 may include simultaneously securing the plurality of bridges 14 within the cavities 12 in the upper surface 18 the substrate 11.

In some forms, [830], [840] attaching the first and second electronic components 16A, 16B to the upper surface 17 of the bridge 14 may include attaching at least three electronic components to the upper surface 17 of at least one bridge 14 and the upper surface 18 of the substrate 11. The number and type of electronic components that are attached to each bridge 14 will depend in part on the overall configuration of the electronic assembly 10 as well as the application where the electronic assembly 10 is to be used (among other factors).

The electronic assemblies and methods described herein may be relatively cost effective due to the elimination of any type of bridge embedding process. The cost may be lowered in part due to the fact is that there are typically yield losses associated with embedding bridges inside substrates.

In addition, the electronic assemblies and methods described herein may provide better pitch scalability in the fine pitch region of the bridge since the fine pitch area of the dies are directly connected to the bridge instead of being connected through substrate routing layers. The improved pitch scaling capability on the bridge is possible because standard fabrication processes may be used to manufacture the bridge. The manufacturing processes that are used to fabricate the bridge are typically significantly more accurate than the manufacturing processes associated with fabricating the substrate.

Figure 9:
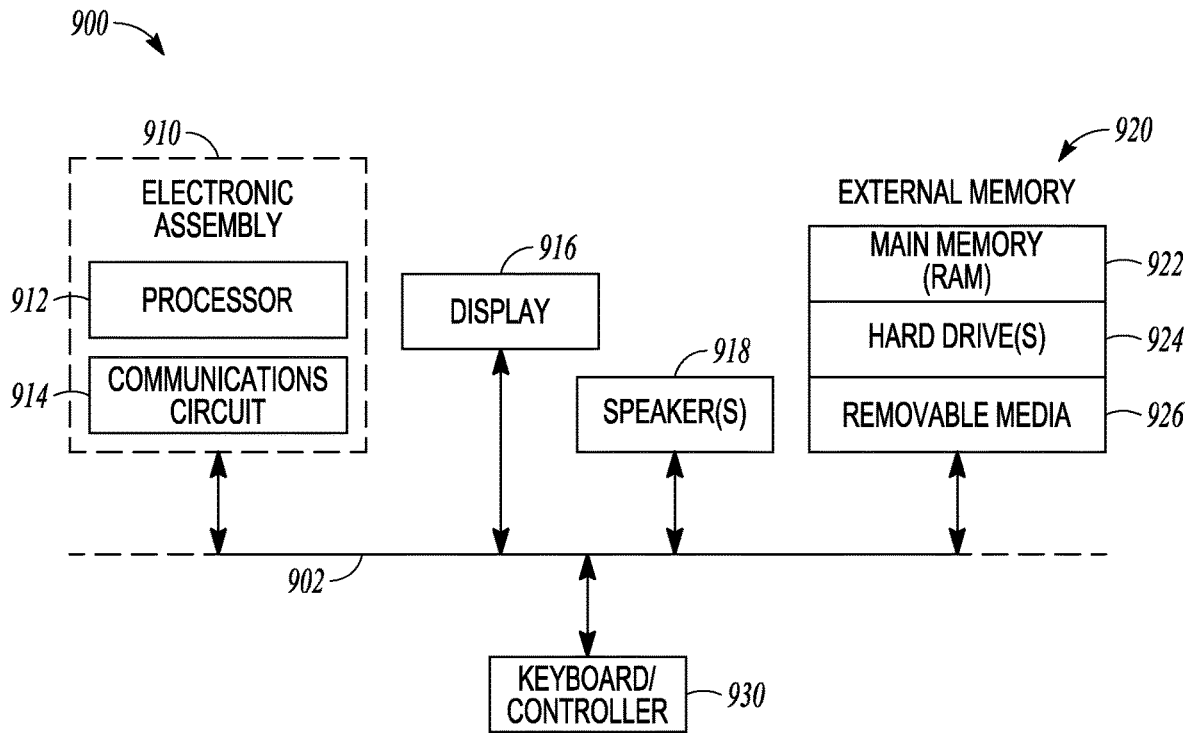
FIG. 9 is block diagram of an electronic apparatus that utilizes the electronic assemblies and methods described herein.

FIG. 9 is a block diagram of an electronic apparatus 900 incorporating at least electronic assembly and/or method described herein. Electronic apparatus 900 is merely one example of an electronic apparatus in which forms of the electronic assemblies and/or methods described herein may be used.

Examples of an electronic apparatus 900 include, but are not limited to, personal computers, tablet computers, mobile telephones, game devices, MP3 or other digital music players, wearable devices etc. In this example, electronic apparatus 900 comprises a data processing system that includes a system bus 902 to couple the various components of the electronic apparatus 900. System bus 902 provides communications links among the various components of the electronic apparatus 900 and may be implemented as a single bus, as a combination of busses, or in any other suitable manner.

An electronic assembly 910 as describe herein may be coupled to system bus 902. The electronic assembly 910 may include any circuit or combination of circuits. In one embodiment, the electronic assembly 910 includes a processor 912 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 910 are a custom circuit, an application-specific integrated circuit (ASIC), or the like, such as, for example, one or more circuits (such as a communications circuit 914) for use in wireless devices like mobile telephones, tablet computers, laptop computers, two-way radios, and similar electronic systems. The IC can perform any other type of function.

The electronic apparatus 900 may also include an external memory 920, which in turn may include one or more memory elements suitable to the particular application, such as a main memory 922 in the form of random access memory (RAM), one or more hard drives 924, and/or one or more drives that handle removable media 926 such as compact disks (CD), flash memory cards, digital video disk (DVD), and the like.

The electronic apparatus 900 may also include a display device 916, one or more speakers 918, and a keyboard and/or controller 930, which can include a mouse, trackball, touch screen, voice-recognition device, or any other device that permits a system user to input information into and receive information from the electronic apparatus 900.

To better illustrate the electronic assemblies and methods disclosed herein, a non-limiting list of examples is provided here:

Example 1 includes an electronic assembly. The electronic assembly includes a substrate that includes an upper surface; a bridge that includes an upper surface; an adhesive that secures the bridge the substrate within a cavity in the upper surface of the substrate; a first die attached to the upper surface of the bridge and the upper surface of the substrate; and a second die attached to the upper surface of the bridge and the upper surface of the substrate, wherein the bridge electrically connects the first die to the second die.

Example 2 includes the electronic assembly of example 1, wherein the bridge is secured to the substrate with a snap cure adhesive.

Example 3 includes the electronic assembly of any one of examples 1-2, wherein the bridge is a rectangle.

Example 4 includes the electronic assembly of any one of examples 1-3, wherein the upper surface of the substrate is aligned with the upper surface of the bridge.

Example 5 includes the electronic assembly of any one of examples 1-4, wherein the bridge includes electrical interconnects that have a pitch less than 50 micrometers.

Example 6 includes the electronic assembly of examples 1-5, wherein the substrate is a printed circuit board, and wherein the bridge is secured to the printed circuit board.

Example 7 includes the electronic assembly of any one of examples 1-6, wherein the bridge includes electrical interconnects that have a pitch less than 50 micrometers.

Example 8 includes the electronic assembly of any one of examples 1-7, and further including at least one additional electronic component attached to the upper surface of the bridge and the upper surface of the substrate.

Example 9 includes the electronic assembly of example 8, wherein the thermal conductor is a heat sink.

Example 10 includes the electronic assembly of example 8, wherein the thermal conductor is entirely embedded within the substrate.

Example 11 includes the electronic assembly of example 8, wherein the thermal conductor is attached to the lower surface of the bridge using a thermally conductive adhesive.

Example 12 includes an electronic assembly. The electronic assembly includes a substrate that includes an upper surface; a plurality of bridges that each include an upper surface, the plurality of bridges being within at least one cavity in the upper surface of the substrate, wherein an adhesive secures the bridges within the cavity in the substrate; a plurality of first electronic components, wherein each of the first electronic components is attached to the upper surface of one of the bridges and the upper surface of the substrate; and a plurality of second electronic components, wherein each of the second electronic components is attached to the upper surface of one of the bridges and the upper surface of the substrate, wherein the bridges electrically connect the first electronic components to the second electronic components.

Example 13 includes the electronic assembly of example 12, wherein at least some of the bridges are embedded within the same cavity in the upper surface of the substrate.

Example 14 includes the electronic assembly of any one of examples 12-13, wherein each of the bridges is embedded within a separate cavity in the upper surface of the substrate.

Example 15 includes the electronic assembly of any one of examples 12-14, wherein the upper surface of the substrate is aligned with the upper surface of each of the bridges.

Example 16 includes the electronic assembly of any one of examples 12-15, wherein the upper surface of the substrate is aligned with the upper surface of each of the bridges.

Example 17 includes a method of fabricating an electronic assembly. The method includes forming a cavity in an upper surface of the substrate; using an adhesive to secure a bridge within the cavity in the upper surface of the substrate; attaching a first electronic component to an upper surface of the bridge and an upper surface of the substrate; and attaching a second electronic component to an upper surface of the bridge and an upper surface of the substrate such that the bridge electrically connects the first electronic component to the second electronic component.

Example 18 includes the method of example 17, wherein using an adhesive to secure the bridge within the cavity in the upper surface of the substrate includes using a thermal compression bonding fixture to secure the bridge within the cavity in the upper surface of the substrate.

Example 19 includes the electronic assembly of any one of examples 17-18, wherein using an adhesive to secure the bridge within the cavity in the upper surface of the substrate includes aligning the upper surface of the substrate with the upper surface of the bridge.

Example 20 includes the electronic assembly of any one of examples 17-19, wherein forming a cavity in an upper surface of the substrate includes forming a plurality of cavities in the upper surface of the substrate, and wherein securing the bridge within the cavity includes securing a plurality of bridges within the cavities in the substrate.

Example 21 includes the electronic assembly of example 20, wherein using an adhesive to secure the plurality of bridges within the cavities in the upper surface of the substrate includes simultaneously securing the plurality of bridges within the cavities.

Example 22 includes the electronic assembly of any one of examples 17-21, wherein attaching first and second electronic components to the upper surface of the bridge includes attaching at least three electronic components to the upper surface of at least one bridge and the upper surface of the substrate.

This overview is intended to provide non-limiting examples of the present subject matter. It is not intended to provide an exclusive or exhaustive explanation. The detailed description is included to provide further information about the electronic assemblies described herein.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic assembly, comprising:
a substrate that includes an upper surface;
a cavity in the upper surface of the substrate, the cavity having a bottom and sidewalls in the substrate, wherein a portion of the substrate is continuous around the bottom and sidewalls of the cavity;
a bridge that includes an upper surface;
a conductor below the bridge;
an adhesive that secures the bridge within the cavity, the adhesive directly on the conductor but not in contact with the sidewalls of the cavity, wherein a void is laterally between the adhesive and the sidewalls of the cavity;
a first die that includes a silicon-on-chip electronic device, the first die directly contacting the upper surface of the bridge and directly contacting the upper surface of the substrate; and
a second die directly contacting the upper surface of the bridge and directly contacting the upper surface of the substrate, wherein the bridge electrically connects the first die to the second die.

2. The electronic assembly of claim 1, wherein the adhesive is a snap cure adhesive.

3. The electronic assembly of claim 1, wherein the bridge is a rectangle.

4. The electronic assembly of claim 1, wherein the upper surface of the substrate is aligned with the upper surface of the bridge.

5. The electronic assembly of claim 1, wherein the bridge includes electrical interconnects that have a pitch less than 50 micrometers.

6. The electronic assembly of claim 1, wherein the substrate is a printed circuit board, and wherein the bridge is secured to the printed circuit board.

7. The electronic assembly of claim 1, further comprising at least one additional electronic component attached to the upper surface of the bridge and the upper surface of the substrate.

8. An electronic assembly, comprising:
a substrate that includes an upper surface;
a cavity in the upper surface of the substrate, the cavity having a bottom and sidewalls;
a bridge that includes an upper surface, the bridge within the cavity;
a first die attached to the upper surface of the bridge and the upper surface of the substrate;
a second die attached to the upper surface of the bridge and the upper surface of the substrate, wherein the bridge electrically connects the first die to the second die;
a thermal conductor connected to a lower surface of the bridge, wherein the thermal conductor is a metallic heat sink that is embedded in the substrate; and
an adhesive that secures the thermal conductor to the bottom of the cavity, the adhesive on the bottom of the cavity but not in contact with the sidewalls of the cavity, wherein a void is laterally between the adhesive and the sidewalls of the cavity.

9. The electronic assembly of claim 8, wherein the thermal conductor is entirely embedded within the substrate.

10. The electronic assembly of claim 8, wherein the thermal conductor is attached to the lower surface of the bridge using a thermally conductive adhesive.

11. An electronic assembly, comprising:
a substrate that includes an upper surface;
a plurality of bridges that each include an upper surface, the plurality of bridges being within at least one cavity in the upper surface of the substrate, wherein an adhesive secures the plurality of bridges within the at least one cavity in the substrate, wherein at least some of the plurality of bridges are embedded within a same cavity of the at least one cavity in the upper surface of the substrate;
a plurality of dice, wherein at least one of the plurality of dice includes a memory module, wherein each of the plurality of dice contacts the upper surface of one of the plurality of bridges and directly contacts the upper surface of the substrate;
wherein the plurality of bridges electrically connects ones of the plurality of dice to others of the plurality of dice.

12. The electronic assembly of claim 11, wherein the upper surface of the substrate is aligned with the upper surface of each of the plurality of bridges.

* * * * *